United States Patent [19]

Kubo et al.

[11] 4,308,368

[45] Dec. 29, 1981

[54] PHOTOSENSITIVE COMPOSITIONS WITH REACTION PRODUCT OF NOVOLAK CO-CONDENSATE WITH O-QUINONE DIAZIDE

[75] Inventors: Keiji Kubo, Amagasaki; Tetsuo Ishihara, Itami, both of Japan

[73] Assignee: Daicel Chemical Industries Ltd., Osaka, Japan

[21] Appl. No.: 130,372

[22] Filed: Mar. 14, 1980

[30] Foreign Application Priority Data

Mar. 16, 1979 [JP] Japan .................................. 54-31579
Mar. 27, 1979 [JP] Japan .................................. 54-36370

[51] Int. Cl.³ .......................... G03C 1/54; C08G 8/24
[52] U.S. Cl. .................................... 525/504; 430/190; 430/192; 430/302; 430/326; 528/158; 528/161; 528/162
[58] Field of Search ............... 430/190, 192, 326, 302; 528/158, 161, 162; 525/504

[56] References Cited

U.S. PATENT DOCUMENTS

| | | | |
|---|---|---|---|
| 3,647,443 | 3/1972 | Rauner et al. | 430/190 |
| 4,123,279 | 10/1978 | Kobayashi | 430/302 |
| 4,217,407 | 8/1980 | Watanabe et al. | 430/190 |

FOREIGN PATENT DOCUMENTS

| | | | |
|---|---|---|---|
| 1227602 | 4/1971 | United Kingdom | 430/190 |
| 1329888 | 9/1973 | United Kingdom | 430/190 |

OTHER PUBLICATIONS

Dinaburg, M. S., "Photosensitive Diazo Cpds", Focal Press, 1964, p. 184 and 188.

*Primary Examiner*—Charles L. Bowers, Jr.
*Attorney, Agent, or Firm*—Hubbell, Cohen, Stiefel & Gross

[57] ABSTRACT

Photosensitive compositions which contain as a photosensitive resin prepared by the condensation of the co-condensated novolak resin of the mixture of phenols such as in a combination of tert-butyl (or tert-octyl) phenol and phenol and/or cresol and formaldehyde, with o-quinonediazido sulfonic (or carboxylic) acid or contain said novolak resin as an additive for a photosensitive o-quinonediazido compound are discosed.

15 Claims, No Drawings

PHOTOSENSITIVE COMPOSITIONS WITH REACTION PRODUCT OF NOVOLAK CO-CONDENSATE WITH O-QUINONE DIAZIDE

BACKGROUND OF THE INVENTION

1. Field of the Invention

This invention relates to photosensitive compositions useful for photomechanical processes and photosensitive copying processes, and more particularly to photosensitive compositions comprising a novel photosensitive resin prepared by condensing a specific alkali-soluble co-condensated novolak resin (hereinafter referred to as "co-condensated novolak resin") with a o-quinonediazido compound and to photosensitive compositions comprising the co-condensated novolak resin and a photosensitive o-quinonediazido compound admixed therewith.

2. Description of the Prior Art

It is widely known that o-benzoquinonediazido compounds and o-naphthoquinonediazido compounds are useful as photosensitive substances for photomechanical and photosensitive copying processes. These o-quinonediazido compounds are usable also in the form of sulfonic acids and carboxylic acids. Similarly useful as photosensitive materials are sulfonic acid esters and carboxylic acid esters of these o-quinonediazido compounds and various hydroxy-containing compounds, and amide compounds prepared from such diazido compounds and various amines.

The above-mentioned o-quinonediazido compounds have the characteristics that when exposed to light, the compounds decompose to form free carboxyl groups, such that when a coating of such compounds is exposed to light and then treated with an aqueous alkali solution such as a solution of sodium tertiary phosphate, the exposed portion dissolves away to give an image area.

However, when used singly as photosensitive materials, such compounds separate out in the form of crystals, are unable to form satisfactory coatings and afford image areas of low mechanical strength. Accordingly it is also known to use o-quinonediazido compounds as admixed with alkali-soluble resins, such as phenol novolak resin, in such manner that the alkali resistance of the nonexposed portion is utilized to prevent the alkali-soluble resin from dissolving in an alkali solution and thereby form images. This method is often used for economical reasons.

Especially for applications in which the image formed on a metal base material is subjected to etching or the image formed on a printing plate is used as it is, it is critical to use an alkali-soluble resin of excellent properties as a support for the o-quinonediazido compounds, whereby the photosensitive layer can be prevented from crystallization to afford an image of improved mechanical strength. For the same purpose, U.S. Pat. No. 3,046,120 discloses a polymer prepared by the condensation of o-benzoquinonediazido sulfonylchloride or o-naphthoquinonediazo sulfonylchloride with an alkali-soluble phenol-formaldehyde resin of the novolak type, or o- or m-cresol-formaldehyde resin. The disclosed compound nevertheless still fails to give images of desired strength since the image area is liable to dissolve away in an aqueous alkali solution and is low in adhesiveness to the base material. Moreover the image area is poor in fat sensitivity.

The object of the present invention is to overcome the drawbacks of the conventional photosensitive compositions of the type described and to provide photosensitive compositions which afford photosensitive materials retaining high resistance to aqueous alkali solutions over the unexposed area when exposed to light and printing plate materials having high fat sensitivity and which can be stored over a prolonged period of time without undergoing noticeable changes in photosensitivity and developing properties.

SUMMARY OF THE INVENTION

The present invention provides photosensitive compositions which contain as the essential component an alkali-soluble co-condensated novolak resin prepared by the condensation of at least one compound represented by the formula (I)

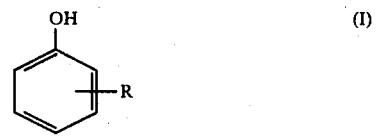

wherein R is an alkyl group having 3 to 12 carbon atoms or phenyl group, at least one of phenol and a methyl-substituted derivative thereof, and formaldehyde, whose co-condensated novolak resin is used in the form of a novel resin condensated with an o-quinonediazidosulforic (or -carboxylic) acid, or used in the admixture with a photosensitive o-quinonediazido compound.

DETAILED DESCRIPTION OF THE INVENTION

The co-condensated novolak resins to be used in this invention are characterized in that the resins contain an alkylphenol having a relatively high molecular weight and represented by the formula (I)

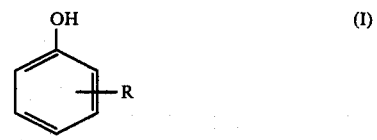

wherein R is an alkyl group having 3 to 12 carbon atoms or phenyl group, and at least one of phenol and a methyl-substituted derivative thereof which have a relatively low molecular weight. The ratio of the components to be used for the preparation of the co-condensated novolak resins is determined according to the characteristics desired, for example, to the developing properties in the presence of an alkali or fat sensitivity. For the preparation of the co-condensated novolak resins, the mole ratio of at least one of the alkylphenols of the formula (I) to at least one of phenol and methyl-substituted derivative thereof is 1:9 to 9:1. Stated more specifically, the above ratio is preferably 4:6 to 8:2 for use in applications where good fat sensitivity is essential as is the case with resisits of printing plates such as pre-sensitized printing plates or typographic printing plates. On the other hand, for second original plates for duplication such as photomasks in which stable developing properties are desirable in preference to fat sensitivity, smaller alkylphenol proportions are preferable. The preferred ratio is then 1:9 to 6:4. Good fat sensitivity and stable developing properties are available when the ratio is 4:6 to 6:4.

Formaldehyde is used in an amount usually used for the preparation of phenolic resins. (for example, see "Plastics Materials 15, Phenolic Resins," published Jan. 20, 1978 by Nikkan Kogyo Shinbunsha, pp. 141–142.) Thus 50 to 100 mole %, preferably 60 to 100 mole %, of formaldehyde is used relative to the total number of moles of the alkylphenol, and phenol and/or methyl-substituted phenol.

Specific examples of compounds of the formula (I) useful for the preparation of the co-condensated novolak resins are phenylphenol, cyclohexylphenol, isopropylphenol, tert-butylphenol, n-butylphenol, tertamylphenol, n-amylphenol, tert-octylphenol, nonylphenol, dodecylphenol, hexylphenol, etc. The alkyl or phenyl group of these compound is preferably in the p-position relative to the hydroxy group.

Examples of useful methyl-substituted phenols are monomethyl-substituted derivatives, such as p-cresol, o-cresol and m-cresol, and dimethylphenols, namely xylenols.

The alkylphenol, phenol and/or methyl-substituted phenols, and formaldehyde are subjected to condensation in the usual manner in the presence of a conventional acid catalyst, such as hydrochloric acid, oxalic acid, zinc acetate or magnesium acetate to give a cocondensed novolak resin. The reaction is conducted under known conditions. Such a resin was prepared in the following manner.

PREPARATION EXAMPLE A

The following starting material were placed into a 1-liter three-necked flask equipped with a sealed stirrer, condenser and thermometer.
Phenol: 2.3 moles
p-tert-Butylphenol: 2.4 moles
Formaldehyde (i.e, 37% formalin): 3.9 moles
35% Hydrochloric acid: 0.5 ml The mixture was stirred at 100° C. for 8 hours. The reaction mixture was thereafter heated at 180° to 190° C. in a vacuum to remove the unreacted formaldehyde, monomer and water, affording a co-condensed novolak resin in a yield of 110% based on the p-tert-butylphenol and phenol.

Condensation products can be prepared in the same manner as above with use of the other alkylphenols exemplified above.

The novel photosensitive o-quinonediazido compounds according to this invention are photosensitive resins prepared by the condensation of the above cocondensed novolak resin with an o-quinonediazido compound represented by the formula (II) or (III).

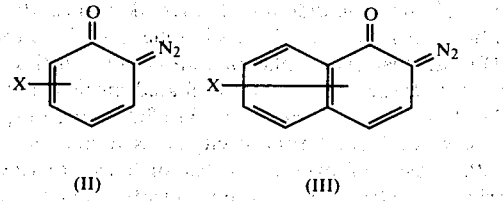

wherein X is a group represented by $-SO_2Y$ or $-COY$, Y meaning a removable group, in an amount of 20 to 100 mole % based on the hydroxy groups in the resin. The group Y in the formula is one which is easily reactive with the hydroxy of the phenol compounds and removable on reaction therewith. Examples are halogen atoms, active imido group, etc.

Good results can be achieved with use of compounds of the formula (II) having the substituent X at the 4-position and compounds of the formula (III) in which the substituent is at the 4- or 5-position.

Examples of preferable compounds of the formula (II) are 1,2-benzoquinonediazido(2)-4-sulfonylchloride, 1,2-benzoquinonediazido(2)-4-carbonylchloride, etc.

Examples of preferable compounds of the formula (III) are 1,2-naphthoquinonediazido(2)-5-sulfonylchloride, 1,2-naphthoquinonediazido(2)-4-sulfonylchloride, 1,2-naphthoquinonediazido(2)-5-carbonylchloride, 1,2-naphthoquinonediazido(2)-4-carbonylchloride, etc.

The condensation of the co-condensed novolak resin with the o-quinonediazido compound of the formula (II) or (III) is effected in an organic solvent, such as acetone, which is miscible with water or in a mixture of such solvent and water in the presence of a base such as sodium carbonate or pyridine at a relatively low temperature as at room temperature.

o-Quinonediazidosulfonyl or o-quinonediazidocarbonyl groups are incorporated into the co-condensed novolak resin in an amount of about 20 to about 100 mole %, preferably about 20 to about 80 mole %, based on the hydroxy groups in the resin. With less than 20 mole % of such groups present, a reduced difference will result in alkali solubility between the exposed area and the unexposed area. Amounts exceeding 80 mole % will not achieve a correspondingly improved result and are not advantageous.

A condensation product will be prepared from the co-condensed novolak resin and an o-naphthoquinonediazido sulfonylchloride, for example, in the following manner.

PREPARATION EXAMPLE B

A 24 g quantity of the co-condensed resin prepared in Preparation Example A and 27 g of 1,2-naphthoquinonediazido(2)-5-sulfonylchloride were dissolved in 400 ml of acetone. A 55 ml quantity of 1 N sodium carbonate solution was added dropwise to the solution at room temperature with stirring while maintaining the resulting mixture at a pH of up to 8. The reaction mixture was poured into 1 liter of 3 N HCl solution to precipitate an oily product, which was separated out by decantation and stirred with a large quantity of water for solidification. The solid product was filtered off, washed with methanol and thereafter dried at a temperature of up to 45° C. Yield 27.4 g.

The photosensitive resin thus obtained is a novel substance and is useful for photosensitive compositions.

The novel photosensitive resins prepared, for example, by the above process according to this invention are the chemically combined products between an o-quinonediazidosulfonic acid or o-quinonediazidocarboxylic acid and a co-condensed novolak resin incorporating an alkylphenol as a phenolic component, so that when the resins are exposed to light, the exposed area can be developed rapidly with an aqueous alkali solution, while the unexposed area retains very high alkali resistance. In fact the image formed will not collapse even when held immersed in a solution having a pH of about 13 or a prolonged period of time. Additionally the photosensitive resins have good storage stability and are capable of forming outstanding coatings. Since the resins have incorporated therein a substituent having affinity for oil, the image area afforded is also outstanding in fat sensitivity, acid resistance and mechanical strength. The resins can be mixed with conventional novolak resins in any ratio.

According to this invention, known photosensitive o-quinonediazido compounds are also used in addition to the novel photosensitive resins. Examples of such compounds are sulfonic acid esters, carboxylic acid esters, sulfonic acid amides, carboxylic acid amides, etc. prepared by the condensation of compounds of the formula (II) or (III) with compounds having hydroxy or amino. More specific examples of useful o-quinonediazido compounds are a condensation product of an o-naphthoquinoediazido sulfonylchloride with a conventional alkali-soluble phenol novolak resin, a reaction product of an o-naphthoquinonediazido sulfonylchloride with phloroglucin, 2,3,4-trihydroxybenzophenone, 2,4,6-trihydroxybenzophenone or polyhydroxyphenol (reaction product of acetone and pyrogallol), a condensation product of an o-benzoquinonediazido sulfonylchloride with a usual phenol novolak resin, etc.

The photosensitive compositions of this invention will now be described.

One type of photosensitive composition comprises at least one of the novel photosensitive resins and suitable additives and is usually in the form of liquid coating compositions. Such a liquid coating composition are prepared by admixing suitable additives with the photosensitive resin and dissolving the mixture in a suitable organic solvents. Examples of useful solvents are acetone, methyl ethyl ketone, ethylene glycol esters, cellosolves, cellosolve acetates, dioxane, butyl acetate and like acetates, mixtures of at least two of these solvents, etc. The concentration of the photosensitive resin in the solvent is, for example, 1 to 30% by weight, preferably 1 to 15% by weight.

Examples of usable additives are polymeric materials, dyes, pigments, sensitizers, etc.

Examples of suitable polymeric materials are cellulose derivatives such as ethyl cellulose, methyl cellulose, propyl cellulose and half ester of cellulose acetate; acrylic resins such as polyacrylic acid (ester), polymethacrylic acid (ester) and copolymer of acrylic acid and acrylic acid having alcoholic hydroxyl; maleic acid copolymers such as styrene-maleic anhydride copolymer and methyl vinyl ether-maleic anhydride copolymer. These materials impart improved applicability to the composition and give the resulting coating enhanced acid resistance, corrosion resistance and strength.

Examples of usable pigments are chrome yellow and carbon black. These pigments render the image more visible and impart light blocking properties to the image for the preparation of negatives. For these purposes, other pigments and dyes are also usable.

The present compositions may further contain conventional alkali-soluble phenol novolak resins, such as cresol resins, alkylphenol resins, vinylphenol resins, etc. When a composition containing such resin in a suitable amount is exposed to light, the exposed area thereof will have a suitably adjusted solubility in an aqueous alkali solution.

The present compositions may further contain a condensation product of a known photosensitive o-quinonediazido compound with a usual alkali-soluble phenol novolak resin.

The photosensitive compositions incorporate these additives (polymeric materials, pigments, sensitizers, etc.) usually in an amount of up to 600 parts by weight, preferably up to 300 parts by weight, per 100 parts by weight of the photosensitive resin.

The compositions of another type according to this invention comprise at least one of the co-condensated novolak resins and a photosensitive o-quinonediazido compound admixed therewith. Useful photosensitive o-quinonediazido compounds include the foregoing novel photosensitive resins prepared by the condensation of a co-condensated novolak resin with an o-quinonediazido compound, and the known photosensitive o-quinonediazido compounds mentioned above. The compositions of this type also incorporate suitable additives and are used usually in the form of liquid coating compositions. Such liquid coating compositions are formulated by preparing a mixture of the co-condensated novolak resin, photosensitive o-quinonediazido compound and suitable additives and dissolving the mixture in a suitable solvent. Useful solvents are those exemplified above for the compositions of the first type. The concentration of the photosensitive o-quinonediazido compound in the solvent is, for example, 1 to 30% by weight, preferably 1 to 15% by weight. The photosensitive compositions may further incorporate another alkali-soluble novolak resin. The same polymeric materials, pigments, dyes and sensitizers as already stated are usable as additives.

The photosensitive compositions contain the co-condensated novolak resin in an amount of 50 to 600 parts by weight, preferably 100 to 400 parts by weight, more preferably 100 to 200 parts by weight, per 100 parts by weight of the o-quinonediazido compound.

The photosensitive compositions of both types described above have high chemical stability, can therefore be stored for a prolonged period of time free of degradation and further possess high fat stability. Accordingly, the photosensitive compositions according to this invention are useful for wide application as photosensitive materials, for example, for reliefs such as wipe-on plates or pre-sentisized plates, for resists as relief and intaglio printing materials, or for metal etching masks, photomasks, second original plates for duplication or the like.

The photosensitive compositions of this invention are used as uniformly applied to the surface of suitable support materials, such as aluminum, zinc, copper and like metal panels, polyester, polypropylene, cellulose acetate and like plastics films, paper, and laminates of paper and such a film or metal panel or sheet. The compositions are applicable by a rotary method, spraying, impregnation or coating with a whirler or roll. After application, the coating is dried to remove the organic solvent. A negative is superposed on the coating surface of the photosensitive material thus prepared and then illuminated with active rays, for example, by a carbon arc lamp, mercury lamp, xenon lamp, chemical lamp, tungsten lamp or the like. At the exposed area of the material, the o-quinonediazido compound is converted to carboxylic acid with the light, and this area becomes soluble in an aqueous alkali solution for development.

Useful aqueous alkali solutions include, for example, an aqueous solution of sodium metasilicate, sodium hydroxide, potassium hydroxide, sodium carbonate, sodium tertiary phosphate or the like, an aqueous solution of two or more of these compounds, and a mixture of such aqueous alkali solution and an organic solvent such as methanol, ethanol or dioxane, with or without an anionic or nonionic surfactant admixed therewith.

The present invention will be described below in greater detail with reference to examples, in which the percentages are by weight unless otherwise indicated.

EXAMPLES 1–2, and COMPARISON EXAMPLE 1

Aluminum plates abraded with ball were immersed in a 5 to 10% aqueous sodium tertiary phosphate solution for a sufficient period of time, washed with water, then immersed in 70% nitric acid, further washed with water, thereafter immersed in a 2% aqueous zirconiun potassium fluoride solution for 2 minutes, and rinsed with water. The aluminum plates thus rendered hydrophilic were then coated with the following photosensitive composition with a whirler.

Photosensitive composition
Photosensitive resin: 6 parts by weight
Novolak phenol resin: 9 parts by weight
Methyl ethyl ketone: 60 parts by weight
Methyl cellosolve acetate: 25 parts by weight The photosensitive resin given above was prepared in the same manner as in Preparation Examples A and B except that the co-condensated novolak resin subjected to condensation with 1,2-naphthoquinonediazido-(2)-5-sulfonylchloride had the ratio of p-tert-butylphenol to phenol shown in Table 1 below (listed as phenol ratio).

TABLE 1

| Example No. | Phenol ratio of novolak resin | Adhesion of printing ink | Developing properties |
| --- | --- | --- | --- |
| Example 1 | 5:5 | Good | 400% |
| Example 2 | 3:7 | Good | 300% |
| Comp. Ex. 1 | Phenol only | Poor | 50% |

The composition was applied to the plates to a thickness of 2.5μ and dried at 70° C. for 10 minutes. A negative film was superposed on the photosensitive layer of one of the plates and exposed to light for 50 seconds using a 2-KW superhigh-pressure mercury lamp positioned 1 m above the plate. The exposed plate was then developed with a 4% aqueous solution of sodium silicate at 30° C. and rinsed with water. Printing ink was applied immediately thereafter to the printing plate thus prepared, and the plate was lightly rubbed several times with sponge, then rinsed with water and checked for the adhesion of ink to the image area.

When the same procedure as above was repeated for each of Examples, the plates of the examples of this invention were found to be more amenable to that of Comparison Example 1 prepared with use of a photosensitive resin containing a usual phenol novolak resin alone.

Further exposed plates were prepared in the same manner as above and developed for a longer period of time to determine the time required for the unexposed area to start dissolving in the developing solution. The prolonged developing time is shown in Table 1 above in terms of percentage relative to the normal developing time measured in the preceding procedure.

Table 1 shows that the positive-type photosensitive resin of this invention assures more stable development, namely, a wider latitude than the conventional resin of Comparison Example 1. Additionally the coatings prepared from the compositions of the invention were found to be very stable and almost free from any changes in developing properties even after having been allowed to stand at room temperature for several months.

EXAMPLE 3

The same photosensitive resin (1 part by weight) as used in Example 1 and 2 parts by weight of a m-cresol novolak resin (which is available on the market) were dissolved in 50 parts by weight of a mixture of methyl cellosolve acetate and methyl ethyl ketone (1:1). The resulting photosensitive composition was applied by a whirler to an aluminum sheet made rough-surfaced by sand-blasting. The coated metal plate was exposed to carbon arc light for 3 minutes through a transparent positive, thereafter developed with a 5% aqueous solution of sodium metasilicate and rinsed with water. With application of oily printing ink, the metal plate was used on an offset press, affording prints with good adhesion of ink.

EXAMPLE 4 p-tert-Butylphenol (58 parts by weight) and 42 parts by weight of phenol were subjected to condensation in the same manner as in Preparation Example A to obtain 30 parts by weight of the co-condensated novolak resin, which was further condensed with 40 parts by weight of 1,2-naphthoquinonediazido(2)-5-sulfonylchloride in the same manner as in Preparation Example B. The photosensitive resin (5 parts by weight) thus obtained, 5 parts by weight of a photosensitive condensated resin prepared from m-cresol novolak resin and 1,2-naphthoquinonediazido(2)-5-sulfonylchloride, and 0.2 part by weight of Methyl Violet were dissolved in 100 parts by weight of methyl cellosolve. The solution was filtered to obtain a photosensitive composition.

The composition was applied by a rotary applicator to a rough-surfaced zinc plate and dried. With a positive film placed on the photosensitive coating in intimate contact therewith, the plate was set in a vacuum printer equipped with a fluorescent lamp and exposed to the light for 2 minutes. The plate was developed with 1.0% aqueous sodium hydroxide solution to remove the exposed area and form thereon a positive resist image having high acid resistance. When etched by the powderless method, the plate was usable as a photomechanical relief.

EXAMPLE 5

An organic coating layer of alcohol-soluble polyamide containing a red organic dye was formed to a dry thickness of 20μ on a biaxially oriented polyethylene terephthalate film. The photosensitive composition of Example 3 was applied to a dry thickness of 3μ to the polyamide layer to form a photosensitive photoresist layer. The photosensitive sheet thus obtained was exposed to light through a negative film for 50 seconds with a 3-KW superhigh-pressure mercury lamp 1.5 m away from the sheet, then developed with a 5% aqueous solution of sodium metasilicate for 2 minutes and thereafter rinsed with water.

Subsequently the developed sheet was lightly rubbed with absorbent cotton impregnated with a mixture of sodium toluenesulfonate, alcohol and water, whereby the polyamide layer was completely removed from the polyester film over the exposed image area of the photoresist layer. The resulting image-forming sheet was usable as a master for a photomechanical plate.

EXAMPLE 6

The same co-condensated novolak resin (24 parts by weight) as prepared in Preparation Example A was reacted with 16 parts by weight of 1,2-naphthoquinonediazido(2)-5-sulfonylchloride in the same manner as in Preparation Example B to obtain a photosensitive resin. The resin (2 parts by weight) and 2 parts by weight of m-cresol novolak resin were dissolved in 40 parts by weight of a mixture of methyl ethyl ketone and methyl cellosolve acetate (2:1) to prepare a photosensitive composition.

Subsequently the same procedure as in Example 3 was conducted, affording satisfactory prints.

EXAMPLE 7

In the same manner as in Preparation Example A, 2.0 moles of phenol, 0.3 mole of m-cresol, 2.3 moles of p-tert-butylphenol and 3.0 moles of formaldehyde were subjected to reaction to obtain a co-condensated novolak resin. A photosensitive resin was prepared in the same manner as in Preparation Example B with use of the resin. The procedure of Example 3 was repeated with use of the resin, whereby good prints were obtained.

EXAMPLE 8

The following photosensitive composition prepared with use of the same co-condensated novolak resin as obtained in Preparation Example A was filtered and then applied by a whirler to aluminum plates rough-surfaced by sand blasting.

- Condensation product of alkali-soluble phenol novolak resin and 1,2-naphthoquinonediazido (2)-5-sulfonylchloride: 5 g
- The co-condensated novolak resin: 10 g
- Solvent (70 vol. % of methyl ethyl ketone and 30 vol. % of methyl cellosolve): 100 g The coated plates were dried in an air dryer at 80° C. to form a 2$\mu$ thick photosensitive coating on the plates. When stored in a dark cool place for several months and thereafter used, the plate exhibited satisfactory properties. Another one of the plates was exposed to light for 2 minutes by a superhigh-pressure mercury lamp at a distance of 1.5 m with a negative film placed on the coating, and immersed in a 5% solution of sodium tertiary phosphate (at 30° C.) for development. The plate was completely developed in about 1 minute.

When another exposed plate was immersed in the developing solution for 5 more minutes, the unexposed area remained intact without dissolving and was found to be highly resistant to the alkali solution. For comparison, the same procedure as above was repeated except that a phenol novolak resin was used in place of the co-condensated novolak resin. The plate was completely developed in about 1 minute. When the plate was continuously immersed in the developing solution for one more minute, the unexposed area started to dissolve.

When the image-forming aluminum plate thus obtained according to the invention was used for planographic printing, the plate was found to highly amenable to adhesion of the ink and highly resistant to abrasion.

EXAMPLE 9

With use of the same co-condensated novolak resin as used in Example 8, the following photosensitive composition was prepared. Using this composition, a photosensitive plate was prepared in the same manner as in Example 8.

- Condensation product of alkali-soluble phenol novolak resin and 1,2-naphthoquinonediazido (2)-5-sulfonylchloride (same as in Ex. 8): 5 g
- The co-condensated novolak resin: 5 g
- Phenol novolak resin ("MP-120," product of Gunei Kagaku K. K. in Japan): 5 g
- Solvent (70 vol. % of methyl ethyl ketone and 30 vol. % of methyl cellosolve): 100 g A negative was placed on the coating surface of the photosensitive plate thus prepared in intimate contact therewith, and the plate was then exposed to light with a superhigh-pressure mercury lamp at a distance of 1.5 m for two minutes and thereafter developed with a solution of the following composition, whereby the exposed area was dissolved away to give a satisfactory image. The plate was rinsed with water and used on an offset printing press, giving a large number of prints with a good image. The plate was found to be highly amenable to the adhesion of the ink.

Composition of developing solution
- Sodium hydroxide: 0.2 g
- Duponol (sodium lauryl sulfate, product of E. I. du Pont de Nemours & Co.): 0.5 g
- Benzyl alcohol: 0.5 g
- Water: 98.8 g

EXAMPLE 10

The following photosensitive composition was prepared with use of a co-condensated novolak resin obtained by the co-condensation of 3.5 moles of p-tert-octylphenol, 1.5 moles of phenol and 4 moles of formaldehyde. The procedure of Example 8 was repeated with use of the composition.

- 1.2-naphthoquinone(2)-5-sulfonate of polyhydroxyphenol: 5 g
- The co-condensated novolak resin: 6 g
- Solvent (80 vol. % of methyl ethyl ketone and 20 vol. % of methyl cellosolve acetate): 100 g The printing plate obtained was satisfactory in adhesion of printing ink and abrasion resistance.

EXAMPLE 11

An organic coating layer of alcohol-soluble polyamide containing a red organic dye was formed to a dry thickness of 20$\mu$ on a biaxially oriented polyethylene terephthalate film. The photosensitive composition of Example 8 was applied to a dry thickness of 3$\mu$ to the polyamide layer to form a photosensitive photoresist layer. The sheet thus obtained was exposed to light through a negative film for 2 minutes with a 3-KW superhigh-pressure mercury lamp 1.5 m away from the sheet, then developed for 1 minute with the developing solution of Example 8 and thereafter rinsed with running water for 30 seconds.

Subsequently the developed sheet was lightly rubbed with absorbent cotton impregnated with a mixture of sodium toluenesulfonate, alcohol and water, whereby the polyamide layer was completely removed from the polyester film over the exposed area of the photoresist layer. The resulting image-forming sheet was useful as a master for a photomechanical plate.

EXAMPLE 12

The procedure of Example 8 was repeated with the exception of using as photosensitive resin an alkalisoluble phenol novolak resin and a condensation product of polyhydroxyphenol and 1,2-naphthoquinonediazido(2)-5-sulfonylchloride. A satisfactory printing plate was obtained.

EXAMPLE 13

The procedure of Example 10 was repeated with the exception of using in place of the co-condensated novolak resin of Example 10 a co-condensated novolak resin prepared by the co-condensation of 2.0 moles of phenol, 0.3 mole of m-cresol, 2.3 moles of p-tertbutylphenol and 3.0 moles of formaldehyde, affording an excellent printing plate.

What is claimed is:

1. A photosensitive composition which comprises a photosensitive resin as an active component which is prepared by condensating an alkali-soluble co-condensated novolak resin prepared by the condensation of a mixture of a mole ratio of 1:9-9:1 of at least one compound represented by the formula (I):

wherein R is an alkyl group having 3 to 12 carbon atoms or phenyl group, at least one of phenol and a methyl-substituted derivative thereof, and formaldehyde in 50-100 mole % relative to said phenol mixture, with a o-quinonediazido compound represented the formula (II) or (III):

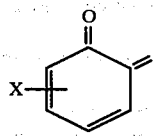 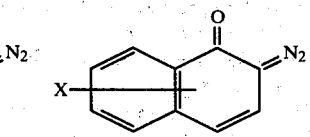

(II)   (III)

wherein X is —SO₂Y or —COY group in which Y is a removable group, in an amount of 20 to 100 mole % based on the hydroxy groups in the novolak resin.

2. A photosensitive composition of claim 1 in which the mole ratio of at least one compound of the formula (I) and at least one of phenol and a methyl substituted derivative thereof is 4:6-6:4.

3. A photosensitive composition of claim 1 in which the o-quinonediazido compound of the formula (II) or (III) is used in an amount of 20-80 mole % based on the hydroxy groups of the novolak resin.

4. A photosensitive composition of claim 1 in which the compound of the formula (I) is p-tertbutylphenol or p-tert-octylphenol.

5. A photosensitive composition of claim 1 in which the o-quinonediazido compound is 1,2-naphthoquinonediazido(2)-5-sulfonyl chloride, 1,2-naphthoquinonediazido(2)-4-sulfonyl chloride, 1,2-naphthoquinonediazido(2)-5-carbonyl chloride or 1,2-naphthoquinonediazido(2)-4-carbonyl chloride.

6. A photosensitive composition of claim 1 which further contains a conventional alkali-soluble phenol novolak resin.

7. A photosensitive composition of claim 1 which contains 600 parts by weight or less of additives to 100 parts by weight of the photosensitive resin.

8. A photosensitive composition of claim 7 in which the additives are 300 parts by weight or less to 100 parts by weight of the photosensitive resin.

9. A photosensitive composition which comprises a photosensitive o-quinonediazido compound and at least one alkali-soluble co-condensated novolak resin prepared by the condensation of a mixture of a mole ratio of 1:9-9:1 of at least one compound represented by the formula (I):

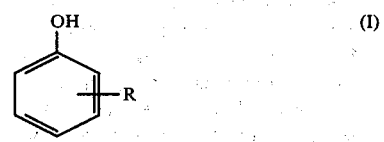

wherein R is an alkyl group having 3-12 carbon atoms or phenyl group, and at least one of phenol and a methyl-substituted derivative thereof, and formaldehyde in 50-100 mole % to said phenol mixture.

10. A photosensitive composition of claim 9 in which the mole ratio of at least one compound of the formula (I) and at least one of phenol and a methyl substituted derivative thereof is 4:6-6:4.

11. A photosensitive composition of claim 9 in which the compound of the formula (I) is p-tert-butylphenol or p-tert-octylphenol.

12. A photosensitive composition of claim 9 in which the photosensitive o-quinonediazido compound is a condensated product of o-naphthoquinonediazidosulfonyl chloride with a conventional alkali-soluble phenol novolak resin; a condensated product of o-naphthoquinonediazidosulphonyl chloride with phloroglucin, 2,3,4-trihydroxybenzophenone, 2,4,6-trihydroxybenzophenone or polyhydroxyphenol; or a condensated product of o-benzoquinonediazidosulfonyl chloride with a conventional alkali-soluble phenol novolak resin.

13. A photosensitive composition of claim 9 in which 50-600 parts by weight of the alkali-soluble co-condensated novolak resin are used to 100 parts of the photosensitive o-quinonediazido compound.

14. A photosensitive composition of claim 13 in which 100-400 parts by weight of the alkali-soluble co-condensated novolak resin are used to 100 parts of the photosensitive o-quinonediazido compound.

15. A photosensitive composition of claim 13 in which 100-200 parts by weight of the alkali-soluble co-condensated novolak resin are used to 100 parts of the photosensitive o-quinonediazido compound.

* * * * *